United States Patent
Bodendorf et al.

(10) Patent No.: US 6,745,380 B2
(45) Date of Patent: Jun. 1, 2004

(54) METHOD FOR OPTIMIZING AND METHOD FOR PRODUCING A LAYOUT FOR A MASK, PREFERABLY FOR USE IN SEMICONDUCTOR PRODUCTION, AND COMPUTER PROGRAM THEREFOR

(75) Inventors: Christof Tilmann Bodendorf, München (DE); Jörg Thiele, München (DE)

(73) Assignee: Infineon Technologies AG, Munich (DE)

(*) Notice: Subject to any disclaimer, the term of this patent is extended or adjusted under 35 U.S.C. 154(b) by 75 days.

(21) Appl. No.: 10/233,691

(22) Filed: Sep. 3, 2002

(65) Prior Publication Data

US 2003/0046654 A1 Mar. 6, 2003

(30) Foreign Application Priority Data

Aug. 31, 2001 (DE) .......................... 101 43 723

(51) Int. Cl.[7] ............................... G06F 17/50
(52) U.S. Cl. ..................... 716/21; 257/207; 716/19; 716/20
(58) Field of Search .................. 257/207; 716/19, 716/20, 21

(56) References Cited

U.S. PATENT DOCUMENTS

| | | | |
|---|---|---|---|
| 5,242,770 A | 9/1993 | Chen et al. | 430/5 |
| 6,120,952 A | 9/2000 | Pierrat et al. | |
| 6,429,469 B1 * | 8/2002 | Allen et al. | 257/207 |
| 6,523,165 B2 * | 2/2003 | Liu et al. | 716/21 |

* cited by examiner

*Primary Examiner*—Vuthe Siek
*Assistant Examiner*—Thuan Do
(74) *Attorney, Agent, or Firm*—Laurence A. Greenberg; Werner H. Stemer; Gregory L. Mayback (57) ABSTRACT

A method of producing a layout for a mask for use in semiconductor production includes a two-stage, iterative optimization of the position of scatter bars in relation to main structures being carried out. In a first stage, following first production of scatter bars and carrying out an OPC, scatter bars are again generated based on the corrected main structures. A renewed OPC is then carried out, followed by the renewed formation of scatter bars. This is repeated until the layout has been optimized sufficiently. Then, in the second stage, defocused exposure of the layout is simulated and, if required, further adaptation of the scatter bars is carried out. The first and second iterative stages can also be employed independently of each other. The common factor in the iterations is that the scatter bar positions are varied with each iteration and is therefore optimized.

27 Claims, 9 Drawing Sheets

METHOD FOR OPTIMIZING AND METHOD FOR PRODUCING A LAYOUT FOR A MASK, PREFERABLY FOR USE IN SEMICONDUCTOR PRODUCTION, AND COMPUTER PROGRAM THEREFOR

BACKGROUND OF THE INVENTION

Field of the Invention

The invention relates to producing fine structures on substrates in lithographic methods for producing structures of microelectronic components by using projection exposure. The invention also relates to a computer program for executing a method for optimizing and a method for producing a layout for a mask.

The wavelengths used in projection exposure are nowadays greater than the smallest dimensions of the structures to be produced on the substrate. Therefore, diffraction effects play a major part in imaging the structures. Diffraction effects flatten the intensity gradient at the edge of a structure because of light being scattered during the exposure of closely adjacent structures.

The unsharpness (i.e. fuzziness) of edges that are produced thereby and the resulting size distortion depend in principle on the relative proximity of the structures on the substrate, the optical wavelength, and the numerical aperture of the exposure device. Thus, given the same exposure (that is to say the same wavelength and numerical aperture), two structures that actually have the same dimensions exhibit different dimensions following exposure, depending on how closely these structures lie to other parts of the exposed layout. The phase and coherence of the light also has an influence. This change in the size relationships as a function of the relative proximity of the structures is called the "proximity effect".

In order to reduce the proximity effect, it is known to carry out an optical proximity correction (OPC) of the structure before creating the mask. An OPC is conducted to ensure that the finished structures on the substrate actually have the sizes envisaged in the layout. The sizes are not obvious because, during the production of a microelectronic component, size changes may occur (for example as a result of the proximity effect mentioned). These are compensated by the OPC.

In that case, the OPC can be conducted by using a simulation program (simulation-based OPC) or a rule-based software system (rule-based OPC).

In order to improve the sharpness of the image in lithography, U.S. Pat. No. 5,242,770 issued to Chen et al. additionally discloses the practice of applying thin lines between the structures on the mask. These lines are so thin that they are not themselves imaged on the substrate by exposure. These scatter bars, as they are known, influence the intensity gradients at the edges of the structures, so that differences between closely packed parts of the structure and further spaced parts of the structures are compensated for. In this case, the scatter bars are disposed at predeterminable intervals parallel to parts of the structure. When placing the scatter bars, an intended ideal distance from the main structures is maintained when compatible with the layout.

The size reduction in semiconductor production has in the meantime progressed so far that structure sizes are smaller than the wavelength of the light used in the lithographic step. The smaller the structure sizes, the more important it is to modify the layouts by using OPC before mask production to account for diffraction effects during the optical imaging.

When the two methods are combined (OPC and scatter bars), however, the following difficulty arises because of their mutual effect: simulation-based OPC has to be carried out while accounting for the lithographic influence of the scatter bars, for which reason the latter has to be generated in the original layout before the correction. Because the dimensions of the main structures are changed by the OPC, deviations in the distances between main structures and scatter bars from the desired ideal distance occur simultaneously. If the scatter bars move too closely to the main structures, then their optical influence becomes so high that the exposure and fabrication tolerances lead to uncontrollable results; on the other hand, if they move too far away, then their positive influence on the process window is lost.

These problems have hitherto been solved by the distance of the scatter bars from the main structures in the original layout (before the correction) having been chosen to be so large that, with the maximum permissible broadening of the main structures as a result of OPC, a necessary minimum distance of the scatter bars from the corrected main structures was guaranteed. As a result, an undesirably large distance from the main structures was produced for the majority of these scatter bars. This forfeits some of the positive influence on the process window.

SUMMARY OF THE INVENTION

It is accordingly an object of the invention to provide a method for optimizing and a method for producing a layout for a mask, preferably for use in semiconductor production, and a computer program therefor, that overcome the hereinafore-mentioned disadvantages of the heretofore-known devices of this general type and that reduce the problems in the prior art.

With the foregoing and other objects in view, there is provided, in accordance with the invention, a method of optimizing a layout for a mask for use in semiconductor production. The layout has main structures and scatter bars. The method includes the following steps. The first step is (a) defining one or more of the main structures. The next step is (b) defining one or more of the scatter bars in accordance with predetermined rules. The next step is (c) carrying out an OPC on the main structures while accounting for the scatter bars. The next step is (d) comparing the corrected main structures with the main structures before step (c). The next step is (e) repeating steps (b) to (e) based on the corrected main structures, depending on the comparison in step (d). In the following text, the above-described method will be designated "Iteration A".

The scatter bars can consequently be iteratively matched optimally to the main structures corrected by using OPC by using the method of the invention.

In particular, the comparison in step (d) can be a comparison of the layers of the main structures, and the definition of the scatter bars in step (b) can be carried out on the basis of the position of the main structures and, when step (b) is repeated, on the basis of a mean value along the edges of the main structures before and after the preceding OPC. As a result, it is possible to avoid, for example, a situation where the scatter bars running along the edges of the corrected main structures are divided into excessively small portions. For instance, in the case of only slight fluctuations in the width of a corrected structure, it is expedient to calculate a mean value relative to which the position of a scatter bar can then be defined.

In general, the iteration should be terminated when the maximum or mean distance of the main structures between two successive iteration steps lies below a predefinable threshold value.

In one refinement of the invention, steps (b) to (e) are repeated if the largest change in a parameter as a result of OPC lies above a predetermined threshold value. By suitably defining the threshold value, the level of optimization of the method to the requirements in semiconductor production can be adapted individually. In this case, the parameter is advantageously a distance between two main structures. An alternative or additional termination criterion can be defined by the OPC grid, that is to say the iteration is terminated as soon as the variation between two successive iteration steps lies below the resolution of the OPC grid.

In another refinement, steps (b) to (e) are repeated only when the main structures do not remain unchanged by the OPC. In this refinement, a higher number of iterations is generally necessary, but this results in a higher level of optimization.

Depending on the refinement, when step (b) is repeated, the position and/or the dimensions of one or more of the scatter bars may be changed. Likewise, during the OPC, the position and/or the dimensions of one or more of the main structures may be changed.

In summary, the iteratively generated scatter bars possess the ideal spacing from the main structures. As a result, the positive influence comes to bear fully on the process window, otherwise than in the case of known methods. At the same time, the danger of falling below the necessary minimum distance of the scatter bars from the main structures is ruled out.

The method can be employed generally for the production of scatter bars, irrespective of its specific software implementation or the OPC and with only slightly widened rules.

With the objects of the invention in view, there is also provided a method of producing a layout for a mask for use in semiconductor production, the layout having main structures and scatter bars, having the following steps:

(a') or (f) simulating a defocused exposure of the mask for imaging at least one of the main structures;

(b') or (g) comparing the main structures obtained in step (a') or (f) with reference main structures; and (c') or (h) varying at least one of the scatter bars and repeating steps (a') or (f) to (c') or (h) based on the comparison in step (b') or (g).

In the following text, the above-described method will be designated "Iteration B".

As a result of Iteration B, according to the invention, the scatter bars are consequently optimized with regard to possible defocusing of the light during lithography. Such defocusing can occur, for example, on account of irregularities on the surface of wafers, as a result of which the distance between wafer surface and light source varies.

In particular, Iteration B permits refinement of the structures created by Iteration A: the corrections explained in conjunction with Iteration A are carried out under "best focus" conditions, as they are known: that is, under the assumption that the light used to expose the mask is focused optimally onto the wafer lying underneath. The ideal distance of scatter bars from the main structures is distinguished by the fact that the lithographic imaging of the main structures remains as stable as possible even in the event of defocusing: that is, approximately independent of the focusing over a certain area. Iteration B is based on the finding that this ideal state is not constant for all situations but depends on the structure width and the position of other adjacent structures.

Therefore, Iteration B can optimize the distances obtained by Iteration A and determined for the ideal state (best possible focusing) further for possible defocusing during the actual semiconductor production. This means that, through Iteration B, optimization is achieved irrespective of the ideal focusing. Iteration B can therefore advantageously follow Iteration A directly.

In step (a') or (f), a simulation of a defocused exposure of the mask at the edge of the process window is advantageously carried out. The edge of the process window designates that area which a predefined tolerance of the structure width because of defocusing is just still maintained. Therefore, defocusing at the edge of the process window also comes to bear to the greatest extent.

Step (a') or (f) is additionally advantageously repeated with different defocusings. In step (b') or (g), each of the main structures obtained with different defocusings are compared with the reference main structures. In this way, optimization of the scatter bars for different defocusings can be achieved, which results in a greater tolerance with respect to wafer irregularities during semiconductor production.

Steps (a') or (f) to (c') or (h) are advantageously repeated when the greatest change in the parameter of the main structures with respect to the reference main structures lies above a predetermined threshold value. By defining the threshold value, the tolerance of the layout with respect to focusing fluctuations during production can be controlled.

The reference main structures are preferably formed by the initial main structures in the layout configuration. Alternatively, the reference main structures can also be formed by "targets" on the wafer.

The optimization of the scatter bars is preferably averaged for the various simulated defocusings, so that the most far-reaching independence of the focusing actually established during the production results.

The parameter is preferably a distance between a main structure and a reference main structure, and the comparison in step (b') or (g) is a comparison of the edges of the main structures.

In one refinement, during variation of the scatter bars in step (c') or (h), a displacement of one or more of the scatter bars by an amount proportional to the difference between the simulated width of one or more of the main structures and one or more predetermined threshold values is carried out. As a result, the number of iteration steps necessary for the optimization can be reduced.

During variation of at least one of the scatter bars in step (c') or (h), the position and/or the dimensions of the at least one scatter bar can be varied.

As already mentioned above, an Iteration A is preferably followed by an Iteration B. Iteration A can then be carried out, followed by a further Iteration B. With each iteration, the layout is optimized further and therefore an enlargement of the usable process window is achieved. Further subsequent Iterations A and B are possible. Termination conditions that correspond to sufficient optimization of the layout preferably are defined for this purpose.

According to the invention, a computer program is additionally created to execute the method steps described above on a computer. The possibility of optimizing a semiconductor layout by computer simulation is therefore provided.

In summary, it should be noted that the common factor in both iterations is that the position of the scatter bars is varied and therefore optimized with each iteration step, specifically on the basis of a comparison of corrected (Iteration A) or simulated (Iteration B) main structures with reference structures (for example the main structures before correction in the case of Iteration A, or initial structures in the case of Iteration B).

Moreover, according to the invention, a method is provided for producing a semiconductor layout having at least one main structure and at least one scatter bar. The method has the following steps. The first step is (a) defining the position and/or dimensions of the main structure. The next step is (b) defining the position and/or dimensions of the scatter bar relative to those of the main structure. The next step is (c) carrying out an OPC of the main structure, taking account of the scatter bar. The next step is (d) comparing the position and/or dimensions of the main structures before and after step (c). The next step is (e) repeating steps (b) to (e) based on the corrected main structure, if the position and/or dimensions of the main structure before step (c) differ from those after step (c) by more than one or more predetermined values. The next step is (a') or (f) simulating a defocused image of the main structure by exposing the layout. The next step is (b') or (g) comparing the position and/or dimensions of the simulated defocused image of the main structure with one or more predetermined values. The next step is (c') or (h) varying the length and/or dimensions of the scatter bar and repeating steps (a') or (f) to (c') or (h) if this deviation in the position and/or dimensions of the simulated defocused image of the main structure from the predetermined values is greater than a likewise predetermined further value.

In this method, Iterations A and B are combined for the most far-reaching optimization.

As indicated further above, the predetermined values can depend on the original structures in the layout configuration or else on targets for the wafer.

With the objects of the invention in view, there is also provided a computer program for executing the above-described methods on a computer.

Other features that are considered as characteristic for the invention are set forth in the appended claims.

Although the invention is illustrated and described herein as embodied in a method for optimizing and method for producing a layout for a mask, preferably for use in semiconductor production, and computer program therefor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
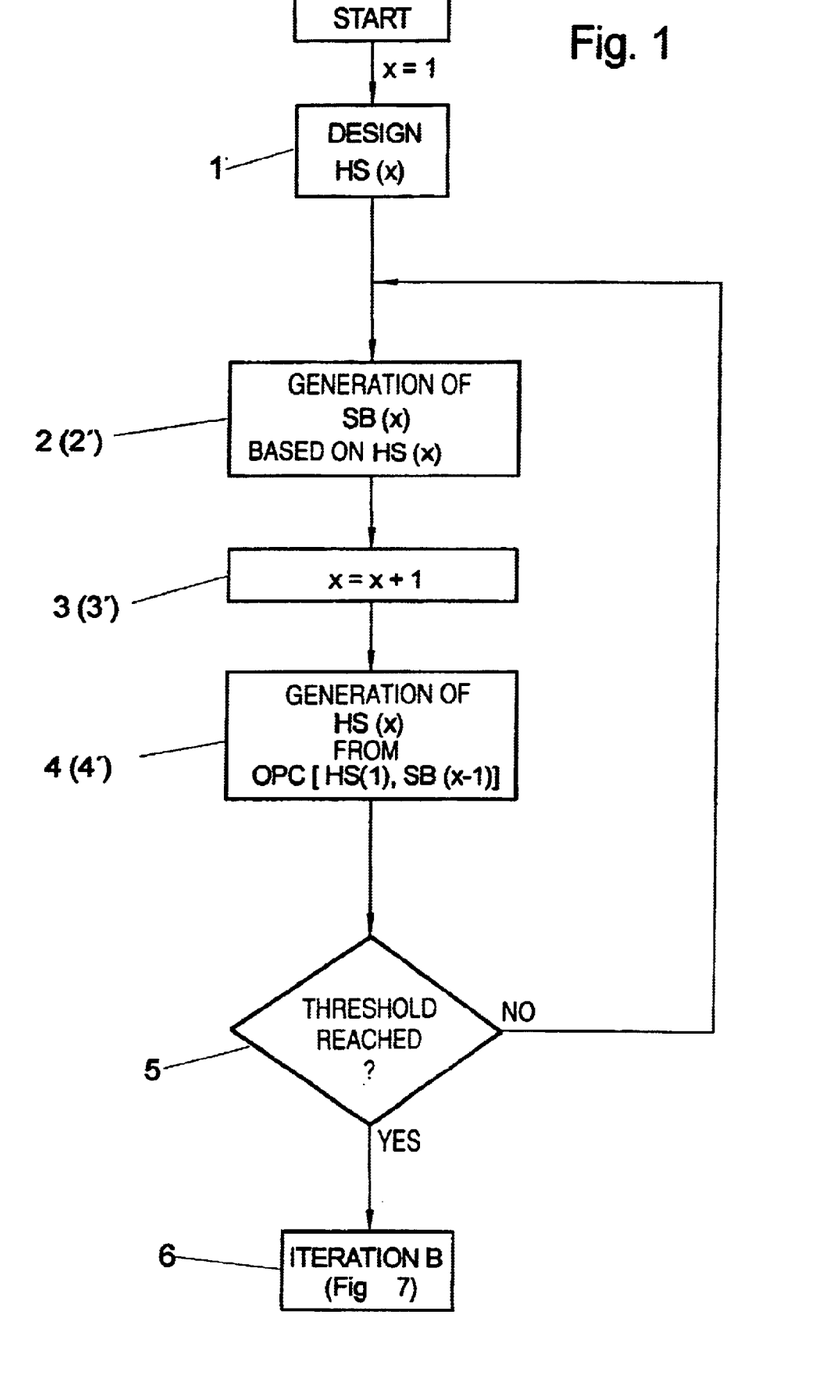
FIG. 1 is a flowchart showing steps in a method according to a first exemplary embodiment of the invention ("Iteration A")

Referring now to the figures of the drawings in detail and first, particularly to FIG. 1 thereof, there is shown a flowchart relating to the diagramatic representation of the method according to a first exemplary embodiment of the invention. The flowchart will now be explained with reference to the schematic representations of main structures HS(X) and scatter bars SB(X) in FIGS. 2 to 6; where X is an ordinal number serving to identify the different parts (i.e. X, {1,2,3, . . . n}).

Figure 2:
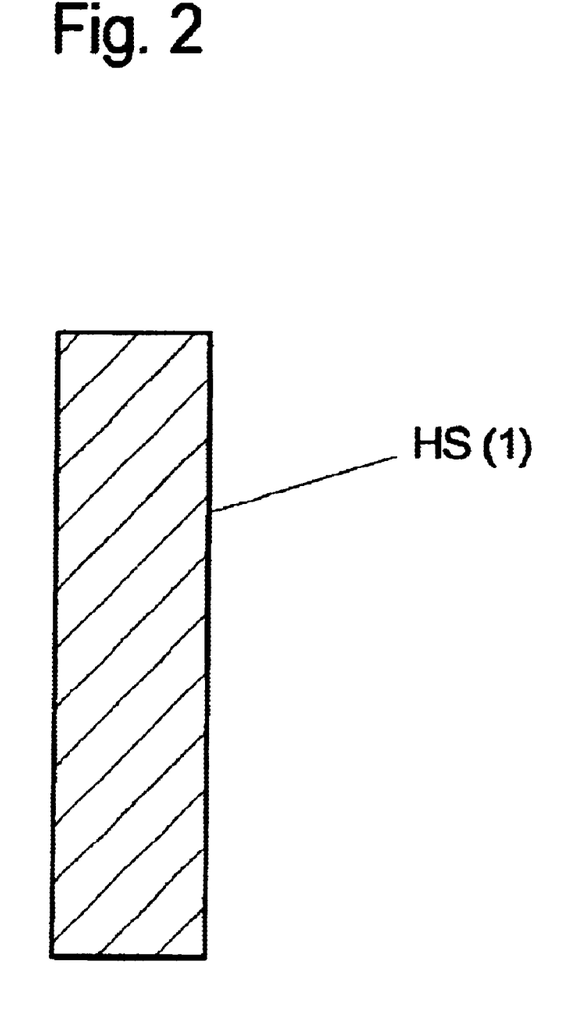
FIG. 2 is a diagrammatic, sectional plan view showing a first main structure of a layout according to the invention.
Figure 3:
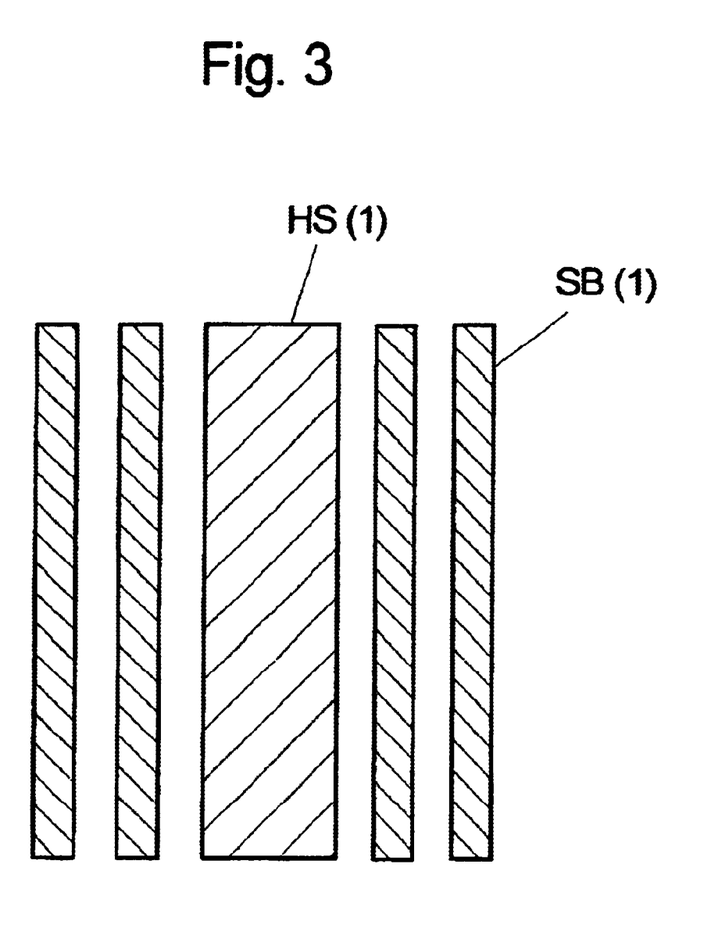
FIG. 3 is a plan view in section showing the first main structure and first scatter bars of a further-developed layout.
Figure 4:
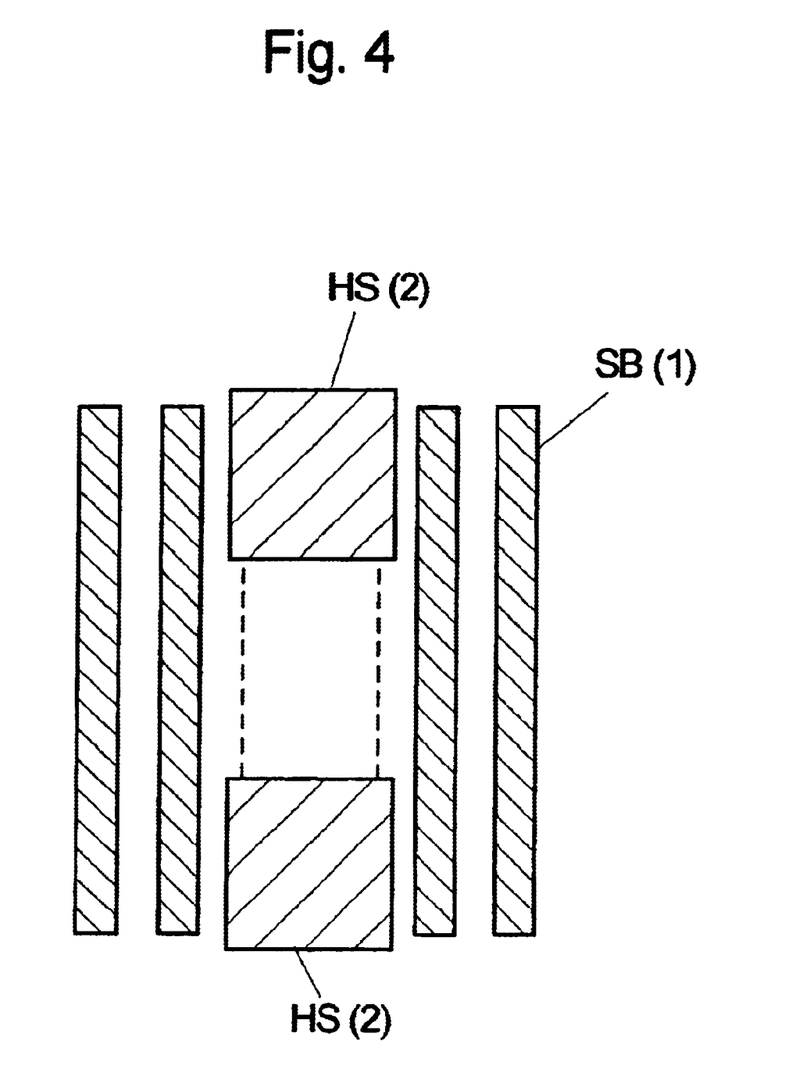
FIG. 4 is a plan view in section showing a second corrected main structure with the first scatter bars of a once more further-developed layout.

In a step 1, an original layout having a main structure HS(X), with X=1, is constructed. An exemplary main structure HS(1) is illustrated in FIG. 2. Then, in a step 2, scatter bars SB(1) are generated with respect to the main structure HS(1). The scatter bars SB(1) are shown on the right and left of the main structure HS(1) in FIG. 3. In a subsequent step 3, the variable X is increased by 1. Then, in a step 4, an OPC of the main structure HS(1) is completed to account for the main structure HS(1) and the scatter bars SB(1). A newly corrected main structure HS(2) is formed in the OPC. The corrected main structure HS(2) is shown in FIG. 4.

In a step 5, it is determined whether the layout is to be optimized by further iteration steps within the scope of the predefined grid on which all the structures in the layout are drawn. This is determined, for example, by comparing the largest change between the two last iteration steps with a predetermined threshold value. If the value reaches or falls below the threshold value (case "YES"), then the iteration is terminated. The main structure HS(X) and scatter bars SB(X) existing at this time then form the layout for producing the mask.

In addition, it is determined in step 5 whether the scatter bars would not be projected onto the substrate during lithography, given their present positioning. If this is the case, then not only must the iteration be terminated but also it is necessary to go back one step in order to avoid this.

Figure 5:
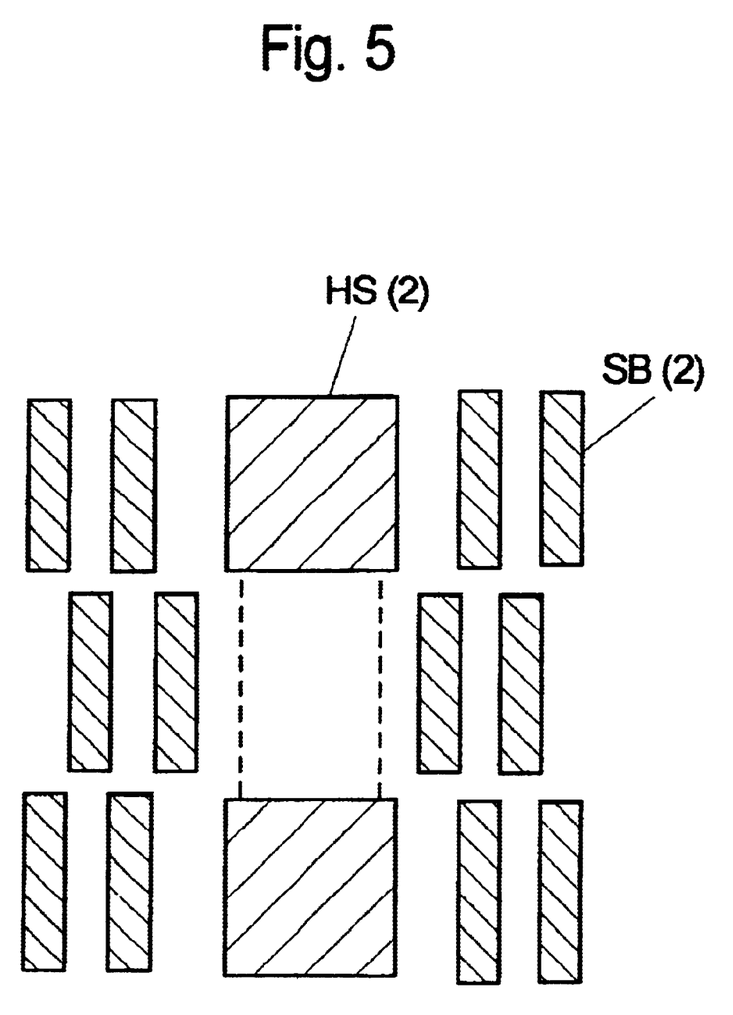
FIG. 5 is a plan view in section showing the second main structure with second adapted scatter bars of a once more further-developed layout.

If the predetermined threshold value is not reached (case "NO"), which is the case with reference to FIGS. 2 to 6, then step 2 is repeated (referred to as step 2' in the following text), but it is necessary to take into account the fact that X has been increased to 2 in the preceding step 3. In step 2', the scatter bars SB(2) are now produced, specifically based on the main structure HS(2) produced in the preceding step 4. The scatter bars SB(2) are illustrated in FIG. 5.

Figure 6:
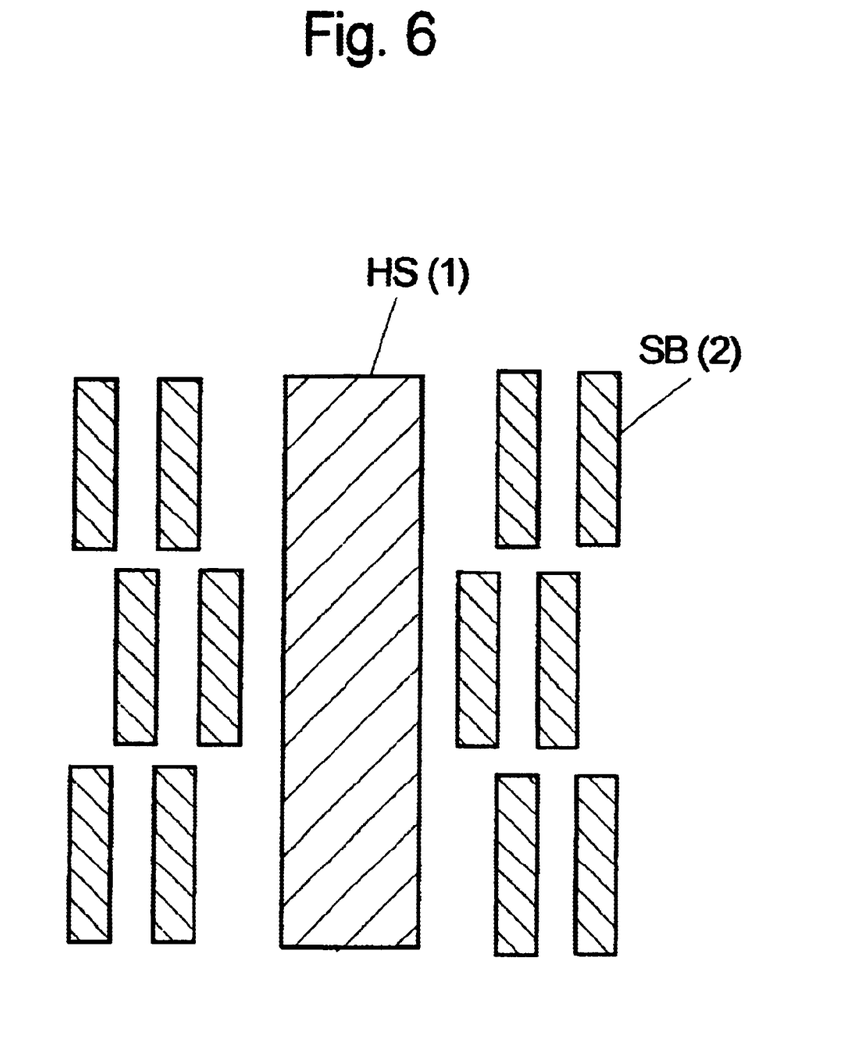
FIG. 6 is a plan view in section showing a combination of the first main structure and of the second scatter bars as the basis of an OPC.

Then, in a repetition of step 3 (step 3'), X is increased and, in a repetition of step 4 (step 4'), a new OPC is carried out based on the original main structure HS(1) and the scatter bars SB(2) produced in step 2'. The combination of the original main structure HS(1) and the current scatter bars SB(2), based on the OPC, is illustrated in FIG. 6.

In the ideal case, the main structure HS(3) generated by the OPC in step 4' would then correspond to the main structure HS(2), so that the aforementioned change between two iterations would be zero and the iteration could be terminated. However, if this is (still) not the case, then the iteration is continued, at least until the value falls below the predetermined threshold value in step 5.

Figure 7:
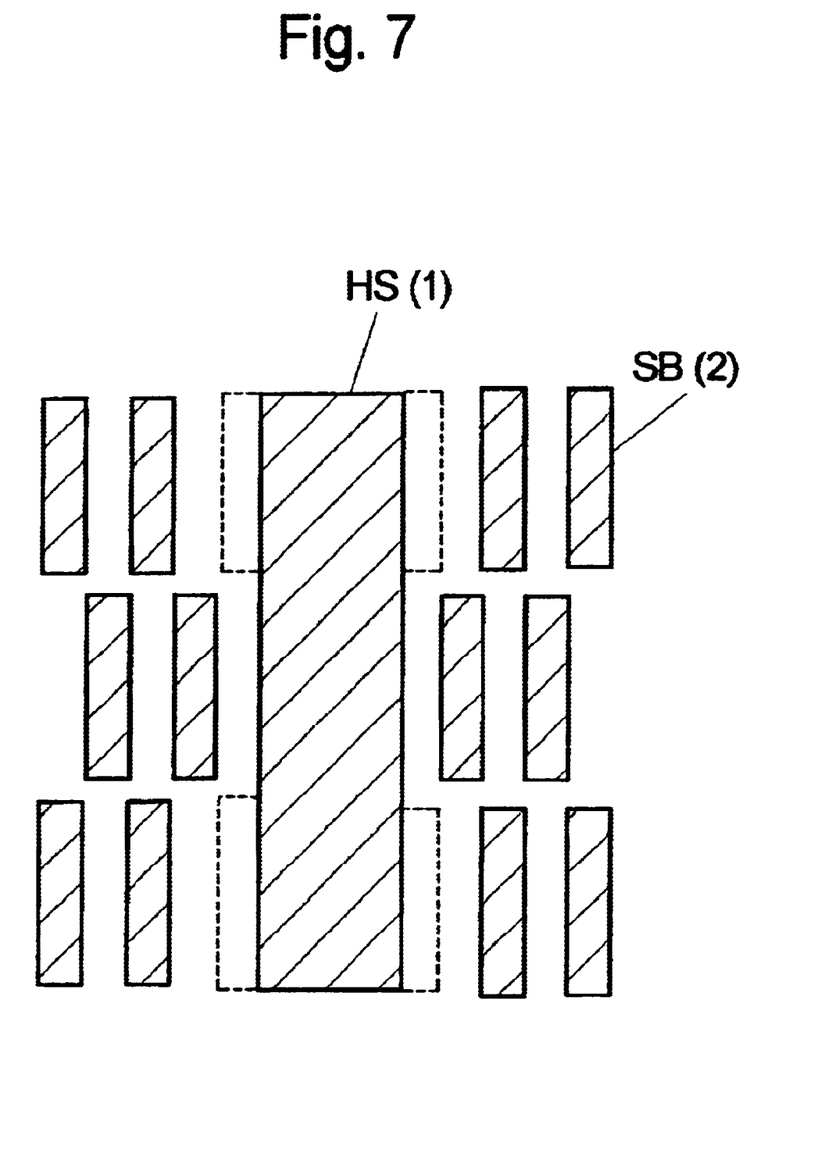
FIG. 7 is a plan view in section showing a main structure with scatter bars after fulfilling the termination criteria of the method.

FIG. 7 shows a possible approximately ideal structure following termination of the iteration.

Figure 8:
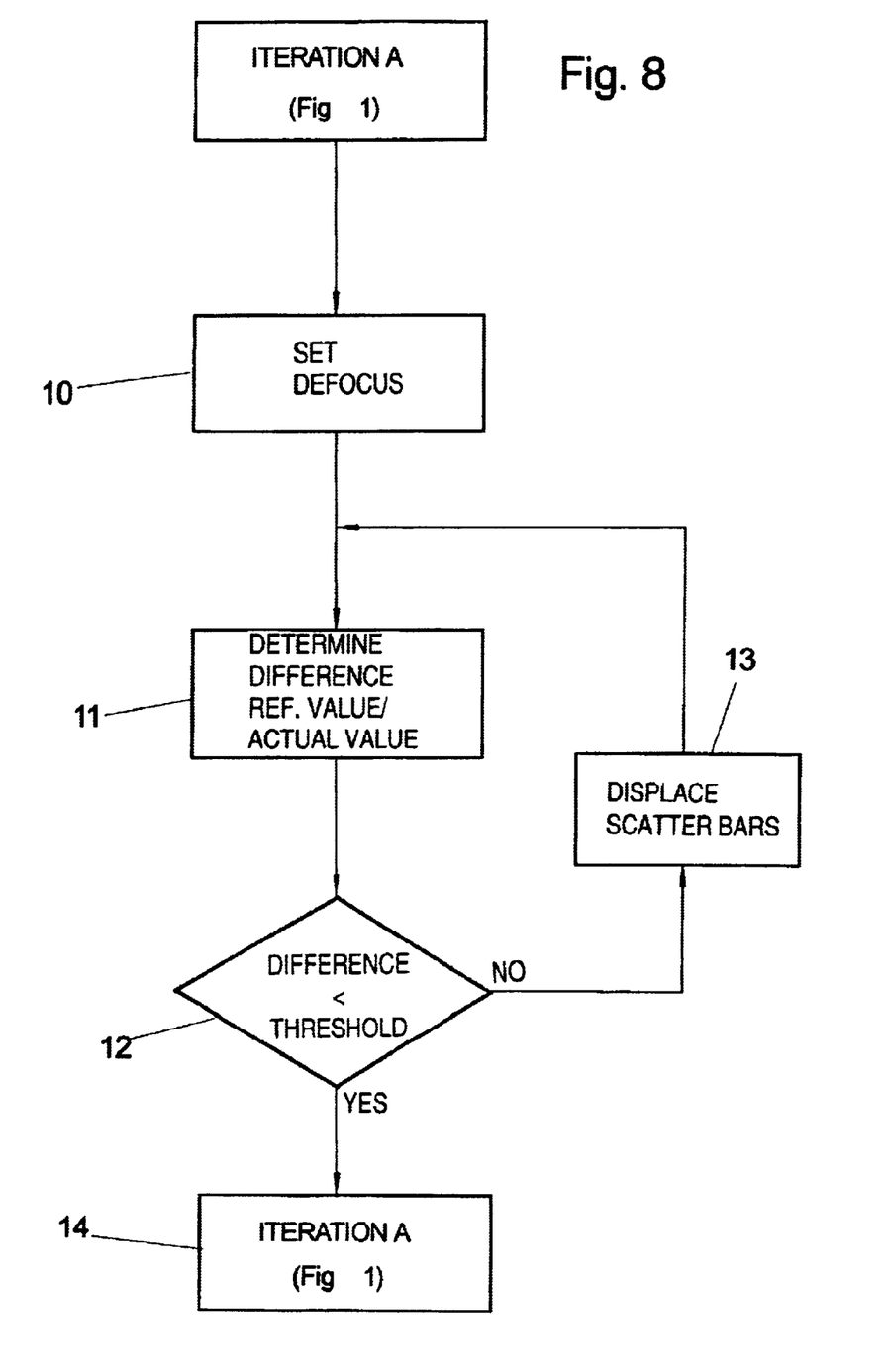
FIG. 8 is a flowchart showing steps in a method according to a second exemplary embodiment of the invention ("Iteration B")

FIG. 8 illustrates, schematically, the progress of the method according to a second exemplary embodiment of the invention (Iteration B), which can optionally follow the Iteration A illustrated in FIG. 1 (step 6 in FIG. 1). In a step 10, in order to carry out a lithographic simulation, the focusing of the simulated exposure source is set. Then, in a step 11, the difference between reference values of the position and/or dimensions of the main structures and actual values of the simulated defocused image is formed. In a step 12, it is determined whether this difference lies below or above a predeterminable threshold value. If the difference is above the threshold value, then the scatter bars are displaced in accordance with the difference between reference values and actual values (step 13), and step 11 is repeated. Otherwise, Iteration B has been completed.

Again, in step 12, it is determined whether the scatter bars would not be imaged onto the substrate during lithography, given their present positioning. If this is the case, then once again not only must the iteration be terminated but also it is necessary to go back one step in order to prevent this.

However, since a small deviation between the actual values of the distances between scatter bars and main structures and the reference values can again be established under "best focus" conditions, it is optionally possible for Iteration A (step 14) to follow again, the distances of the scatter bars from the main structures as determined in Iteration B then being maintained.

Following this, Iteration B can then again follow, and so on. By defining suitable termination conditions (threshold values), this sequence and the repetition of Iterations A and B can be controlled.

In summary, by using Iteration A, the layout width of the main structures is optimized under "best focus" conditions and by using predetermined rules for the positioning of scatter bars, while by using Iteration B, given a constant layout width of the main structures, the "defocus" behavior is optimized by adapting the rules to the positioning of the scatter bars.

Figure 9:
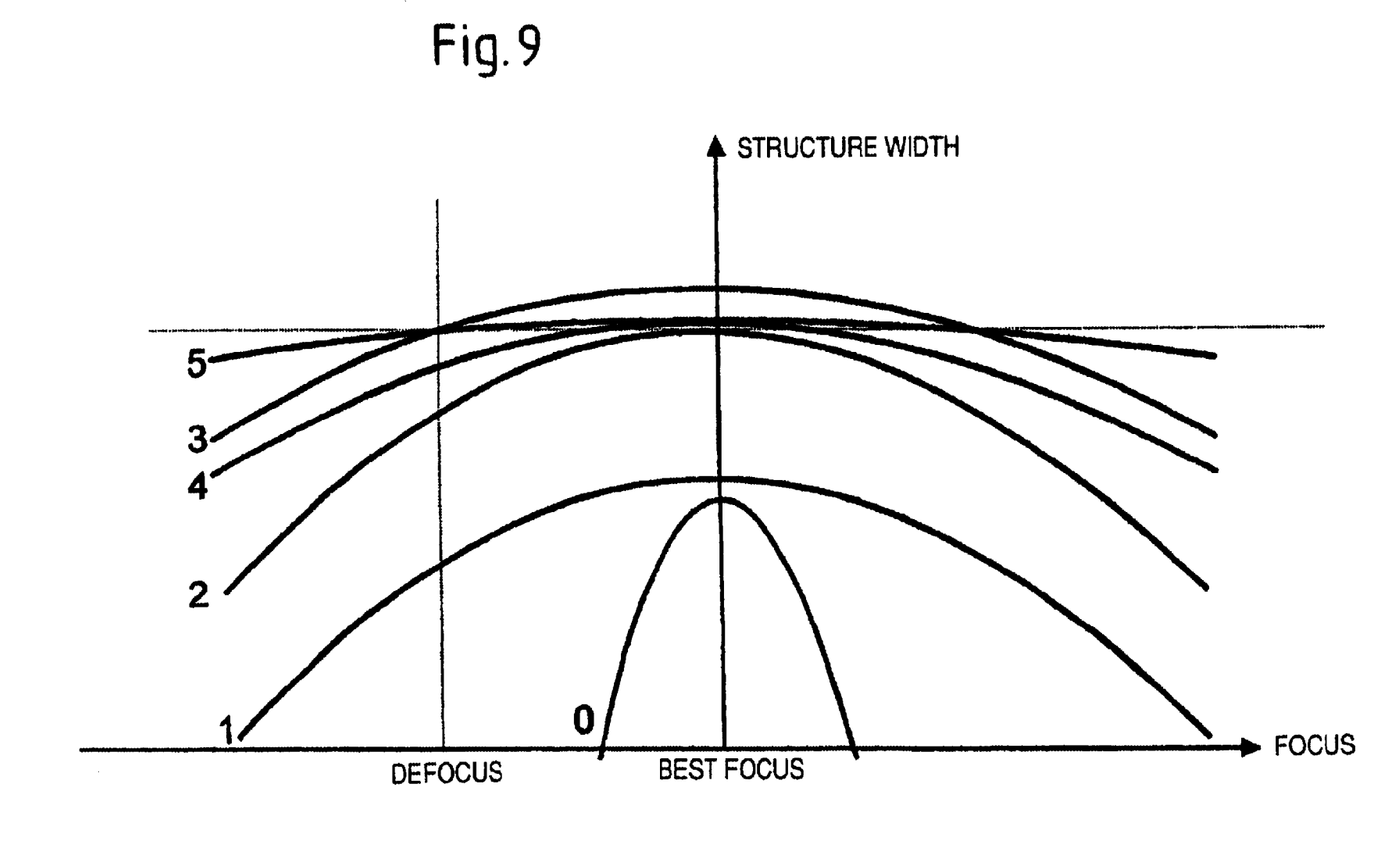
FIG. 9 is a graph of a curve plotting structure width versus focus.

FIG. 9 shows an illustrative graph that represents the course of structure widths schematically as a function of the focusing during lithography. It can be seen that, by using auxiliary measures such as scatter bars (curve 1), Iteration A (curve 2), Iteration B (curve 3), repetition of Iteration A (curve 4), and repetition of Iteration B (curve 5), the dependence of the change in the structure widths on the focusing decreases; that is to say the curve becomes increasingly flat. As opposed to this, the width of the structures of a layout without scatter bars (curve 0) is influenced largely by the focusing.

FIG. 9 illustrates how, by using the measures according to the invention, the process window, that is to say the window within which during semiconductor production the deviations of the structure widths from a reference value must lie within predefined tolerances (for example 10%), can be enlarged. This results in cost savings during the production of semiconductor elements (better utilization of the wafer area available; less waste; smaller structures). In addition, the effect of surface irregularities of wafers on which structures are depicted in a defocused manner during lithography is reduced.

It should be noted that the invention is not restricted to the exemplary embodiments described but includes modifications within the area of protection defined by the claims. In particular, it should be noted that Iterations A and B can be employed independently of each other.

We claim:

1. A method of optimizing a layout for a mask, which comprises the following steps:
    (a) defining at least one of a plurality of main structures of the layout;
    (b) defining at least one of a plurality of scatter bars of the layout in accordance with predetermined rules;
    (c) carrying out an OPC on the main structures while accounting for the scatter bars to yield respective corrected main structures;
    (d) comparing the corrected main structures with the main structures before step (c) to yield a result; and
    (e) repeating steps (b) to (e) based on the corrected main structures depending on the result of the comparing step (d).

2. The method according to claim 1, which further comprises initially carrying out the step of defining the at least one of the scatter bars in step (b) based on a position of the at least one of the main structures and, when step (b) is repeated, subsequently based on a mean value of positions of the at least one of the main structures before and after the preceding OPC.

3. The method according to claim 1, wherein the comparing step (d) includes comparing layers of the at least one of the main structures.

4. The method according to claim 1, which further comprises repeating steps (b) to (e) if a greatest change in a parameter as a result of the OPC lies above a predetermined threshold value.

5. The method according to claim 4, which further comprises:
    in step (a), defining a second main structure; and
    defining the parameter as a distance between the two main structures.

6. The method according to claim 1, which further comprises repeating steps (b) to (e) only when the at least one of the main structures remain unchanged by the OPC.

7. The method according to claim 1, which further comprises repositioning at least one of the scatter bars if step (b) is repeated.

8. The method according to claim 1, which further comprises changing dimensions of the at least one of the scatter bars if step (b) is repeated.

9. The method according to claim 1, wherein the at least one of the main structures is changed during the OPC.

10. The method according to claim 1, wherein dimensions of the at least one of the main structures is changed during the OPC.

11. A method of producing a layout for a mask, which comprises the following steps:
    (a') simulating a defocused exposure of the mask for imaging at least one of a plurality of main structures of the layout;
    (b') comparing the at least one of the main structures obtained in step (a') with reference main structures to yield a result; and
    (c') varying at least one of a plurality of scatter bars of the layout and repeating steps (a') to (c') based on the result of the comparing step (b').

12. The method according to claim 11, wherein step (a') includes simulating a defocused exposure of the mask at an edge of a process window.

13. The method according to claim 11, which further comprises:
   repeating step (a') with different defocusings; and
   in step (b'), comparing each of the main structures obtained with the different defocusings with the reference main structures.

14. The method according to claim 11, wherein step (b') includes comparing layers of the main structures.

15. The method according to claim 11, which further comprises repeating steps (a') to (c') if a largest change in a parameter of the main structures as compared with the reference main structures lies above a predetermined threshold value.

16. The method according to claim 15, which further comprises setting the parameter as a distance between one of the main structures and the respective reference main structure.

17. The method according to claim 11, which further comprises:
   in step (a'), simulating a width of the at least one of the main structures; and
   if the at least one of the scatter bars in step (c') is varied, displacing at least one of the scatter bars by an amount proportional to the difference between the simulated width of the at least one of the main structures and at least one predetermined threshold values.

18. The method according to claim 11, wherein step (c') includes repositioning the at least one scatter bars.

19. The method according to claim 11, wherein step (c') includes changing the dimensions of the at least one of the scatter bars.

20. A method of producing a layout for a mask for use in semiconductor production, which comprises the following steps:
   (a) defining at least one of a plurality of main structures of the layout;
   (b) defining at least one of a plurality of scatter bars in accordance with predetermined rules;
   (c) carrying out an OPC on the main structures while accounting for the scatter bars to yield corrected main structures;
   (d) comparing the corrected main structures with the main structures before step (c) to yield a result;
   (e) repeating steps (b) to (e) based on the corrected main structures depending on the result of the comparing step (d);
   (f) simulating a defocused exposure of the mask for imaging the at least one of the main structures;
   (g) comparing the at least one of the main structures obtained in step (f) with reference main structures to yield a result; and
   (h) varying at least one of the scatter bars and repeating steps (f) to (h) based on the result of the comparing step (g).

21. The method according to claim 20, which further comprises subsequently repeating at least one of steps (a) through (e) and steps (f) through (h) until the layout is not changed further by further iteration.

22. The method according to claim 20, which further comprises subsequently repeating at least one of steps (a) through (e) and steps (f) through (h) until the layout corresponds to at least one predetermined criteria.

23. A method of optimizing a semiconductor layout, which comprises the following steps:
   (a) defining at least one of a position and dimensions of a main structure of the layout;
   (b) defining at least one of a position and dimensions of a scatter bar of the layout relative to those of the main structure;
   (c) carrying out an OPC of the main structure while accounting for the scatter bars to yield a corrected main structure;
   (d) comparing at least one of the position and dimensions of the main structure before step (c) with the corrected main structure;
   (e) repeating steps (b) to (e) on the corrected main structure, if at least one of the position and dimensions of the main structure before step (c) differ from those of the corrected main structure after step (c) by more than at least one predetermined value;
   (f) simulating a defocused image of the main structure by exposing the layout;
   (g) comparing at least one of the position and dimensions of the simulated defocused image of the main structure with at least one predetermined value; and
   (h) varying at least one of the length and dimensions of the scatter bar; and
   repeating steps (f) to (h) if a deviation in at least one of the position and dimensions of the simulated defocused image of the main structure from the at least one predetermined value is greater than a further predetermined value.

24. A computerized method for producing optimizing a layout of a mask, which comprises the following steps:
   (a) defining at least one of a plurality of main structures of the layout;
   (b) defining at least one of a plurality of scatter bars of the layout in accordance with predetermined rules;
   (c) carrying out an OPC on the main structures while accounting for the scatter bars to yield respective corrected main structures;
   (d) comparing the corrected main structures with the main structures before step (c) to yield a result; and
   (e) repeating steps (b) to (e) based on the corrected main structures depending on the result of the comparing step (d).

25. A computerized method for optimizing a layout of a mask, which comprises the following steps:
   (a') simulating a defocused exposure of the mask for imaging at least one of a plurality of main structures of the layout;
   (b') comparing the at least one of the main structures obtained in step (a') with reference main structures to yield a result; and
   (c') varying at least one of a plurality of scatter bars of the layout and repeating steps (a') to (c') based on the result of the comparing step (b').

26. A computer method for producing a layout for a mask for use in semiconductor production, which comprises the following steps:
   (a) defining at least one of the main structures;
   (b) defining at least one of the scatter bars in accordance with predetermined rules;
   (c) carrying out an OPC on the main structures while accounting for the scatter bars to yield corrected main structures;
   (d) comparing the corrected main structures with the main structures before step (c) to yield a result;
   (e) repeating steps (b) to (e) based on the corrected main structures depending on the result of the comparing step (d);

(f) simulating a defocused exposure of the mask for imaging the at least one of the main structures;

(g) comparing the at least one of the main structures obtained in step (f) with reference main structures to yield a result; and (h) varying at least one of the scatter bars and repeating steps (f) to (h) based on the result of the comparing step (g).

27. A computerized method for optimizing a semiconductor layout, which comprises the following steps:

(a) defining at least one of a position and dimensions of the main structure;

(b) defining at least one of a position and dimensions of the scatter bar relative to those of the main structure;

(c) carrying out an OPC of the main structure while accounting for the scatter bars to yield a corrected main structure;

(d) comparing at least one of the position and dimensions of the main structure before step (c) and the corrected main structure;

(e) repeating steps (b) to (e) on the corrected main structure, if at least one of the position and dimensions of the main structure before step (c) differ from those of the corrected main structure after step (c) by more than at least one predetermined value;

(f) simulating a defocused image of the main structure by exposing the layout;

(g) comparing at least one of the position and dimensions of the simulated defocused image of the main structure with at least one predetermined value;

(h) varying at least one of the length and dimensions of the scatter bar; and repeating steps (f) to (h) if a deviation in at least one of the position and dimensions of the simulated defocused image of the main structure from the at least one predetermined value is greater than a further predetermined value.

* * * * *